(12) United States Patent
Hush

(10) Patent No.: US 10,049,707 B2
(45) Date of Patent: Aug. 14, 2018

(54) SHIFTING DATA

(71) Applicant: Micron Technology, Inc., Boise, ID (US)

(72) Inventor: Glen E. Hush, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/173,163

(22) Filed: Jun. 3, 2016

(65) Prior Publication Data

US 2017/0352391 A1    Dec. 7, 2017

(51) Int. Cl.
G11C 7/00    (2006.01)
G11C 7/12    (2006.01)
G11C 8/04    (2006.01)
G11C 7/06    (2006.01)

(52) U.S. Cl.
CPC ............. G11C 7/12 (2013.01); G11C 7/065 (2013.01); G11C 8/04 (2013.01)

(58) Field of Classification Search
CPC .. G11C 7/12; G11C 7/065; G11C 7/06; G11C 7/1006; G11C 8/04; G11C 8/10; G11C 8/12
See application file for complete search history.

(56) References Cited

U.S. PATENT DOCUMENTS

| 4,380,046 A | 4/1983 | Fung |
|---|---|---|
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |

(Continued)

FOREIGN PATENT DOCUMENTS

| CN | 102141905 | 8/2011 |
|---|---|---|
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Toan Le

(74) *Attorney, Agent, or Firm* — Brooks, Cameron & Huebsch, PLLC

(57) ABSTRACT

The present disclosure includes apparatuses and methods related to shifting data. A number of embodiments of the present disclosure include an apparatus comprising a shift register comprising an initial stage and a final stage. The shift register may be configured such that a clock signal may be initiated at the final stage of the shift register.

28 Claims, 6 Drawing Sheets

(56) References Cited

U.S. PATENT DOCUMENTS

| | | |
|---|---|---|
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,671,183 A * | 9/1997 | Soenen ............... G01R 31/30 365/189.12 |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,165 A * | 7/2000 | Bolyn ............... G06F 13/1694 711/105 |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,692,466 B2 | 4/2010 | Ahmadi |
| 7,685,365 B2 | 5/2010 | Rajwar et al. |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |

(56) References Cited

U.S. PATENT DOCUMENTS

| | | | |
|---|---|---|---|
| 2002/0093871 A1* | 7/2002 | Kwak | G11C 7/1072 365/233.1 |
| 2003/0167426 A1 | 9/2003 | Slobodnik | |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0178053 A1 | 7/2008 | Gorman et al. | |
| 2008/0215937 A1 | 9/2008 | Dreibelbis et al. | |
| 2008/0165601 A1 | 12/2008 | Matick et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134226 A1 | 5/2012 | Chow | |
| 2012/0135225 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0029798 A1 | 1/2015 | Manning | |
| 2015/0042380 A1 | 2/2015 | Manning | |
| 2015/0063052 A1 | 3/2015 | Manning | |
| 2015/0078108 A1 | 3/2015 | Cowles et al. | |
| 2015/0279466 A1 | 3/2015 | Manning | |
| 2015/0120987 A1 | 4/2015 | Wheeler | |
| 2015/0134713 A1 | 5/2015 | Wheeler | |
| 2015/0270015 A1 | 9/2015 | Murphy et al. | |
| 2015/0324290 A1 | 11/2015 | Leidel | |
| 2015/0325272 A1 | 11/2015 | Murphy | |
| 2015/0356009 A1 | 12/2015 | Wheeler et al. | |
| 2015/0356022 A1 | 12/2015 | Leidel et al. | |
| 2015/0357007 A1 | 12/2015 | Manning et al. | |
| 2015/0357008 A1 | 12/2015 | Manning et al. | |
| 2015/0357019 A1 | 12/2015 | Wheeler et al. | |
| 2015/0357020 A1 | 12/2015 | Manning | |
| 2015/0357021 A1 | 12/2015 | Hush | |
| 2015/0357022 A1 | 12/2015 | Hush | |
| 2015/0357023 A1 | 12/2015 | Hush | |
| 2015/0357024 A1 | 12/2015 | Hush et al. | |
| 2015/0357047 A1 | 12/2015 | Tiwari | |
| 2016/0003901 A1* | 1/2016 | Park | G01R 31/318538 714/727 |
| 2016/0062672 A1 | 3/2016 | Wheeler | |
| 2016/0062673 A1 | 3/2016 | Tiwari | |
| 2016/0062692 A1 | 3/2016 | Finkbeiner et al. | |
| 2016/0062733 A1 | 3/2016 | Tiwari | |
| 2016/0063284 A1 | 3/2016 | Tiwari | |
| 2016/0064045 A1 | 3/2016 | La Fratta | |
| 2016/0064047 A1 | 3/2016 | Tiwari | |
| 2016/0098208 A1 | 4/2016 | Willcock | |
| 2016/0098209 A1 | 4/2016 | Leidel et al. | |
| 2016/0110135 A1 | 4/2016 | Wheeler et al. | |
| 2016/0125919 A1 | 5/2016 | Hush | |
| 2016/0154596 A1 | 6/2016 | Willcock et al. | |
| 2016/0155482 A1 | 6/2016 | La Fratta | |
| 2016/0241219 A1* | 8/2016 | Kim | G01R 31/3177 |
| 2016/0372023 A1* | 12/2016 | Zhang | G09G 3/2092 |
| 2016/0372034 A1* | 12/2016 | Zhou | G09G 3/3225 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

(56) References Cited

OTHER PUBLICATIONS

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.

\* cited by examiner

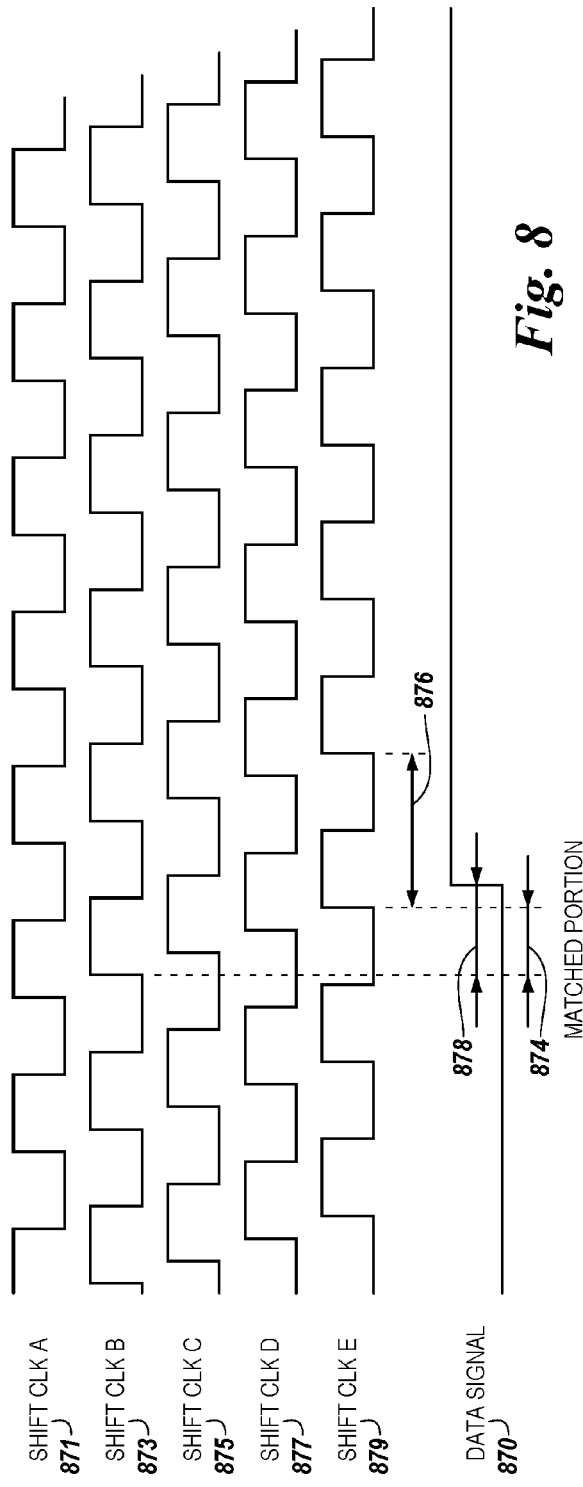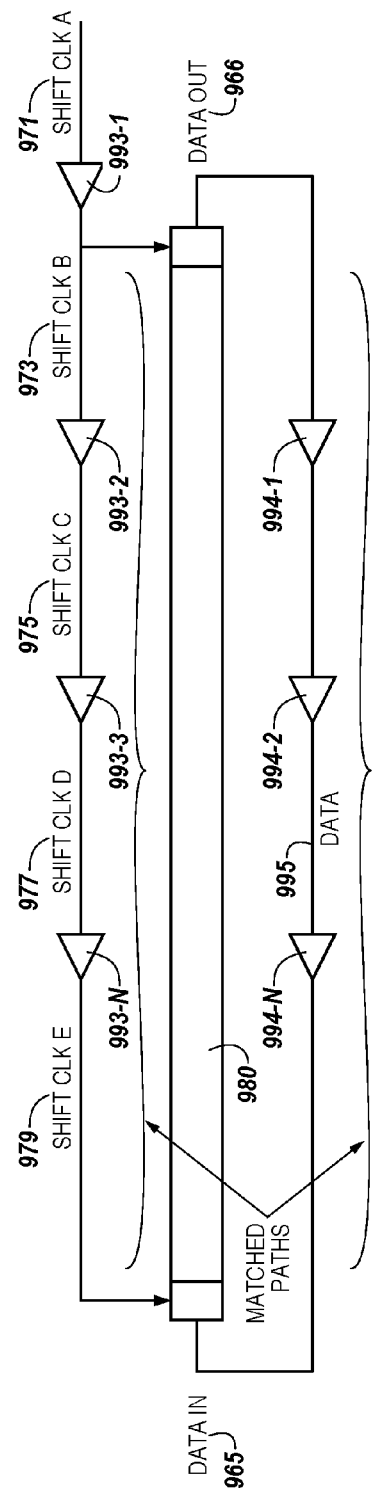

SHIFTING DATA

TECHNICAL FIELD

The present disclosure relates generally to semiconductor memory and methods, and more particularly, to apparatuses and methods related to shifting data.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may reduce time in processing and may also conserve power. Data movement between and within arrays and/or subarrays of various memory devices, such as processing-in-memory devices, can affect processing time and/or power consumption.

BRIEF DESCRIPTION OF THE DRAWINGS

FIG. 8 illustrates a timing diagram including a data signal and a plurality of shift clock signals associated with shifting data in accordance with a number of embodiments of the present disclosure.

FIG. 9 illustrates a clock path and a data path associated with shifting data in a shift register in accordance with a number of embodiments of the present disclosure.

DETAILED DESCRIPTION

Figure 1:
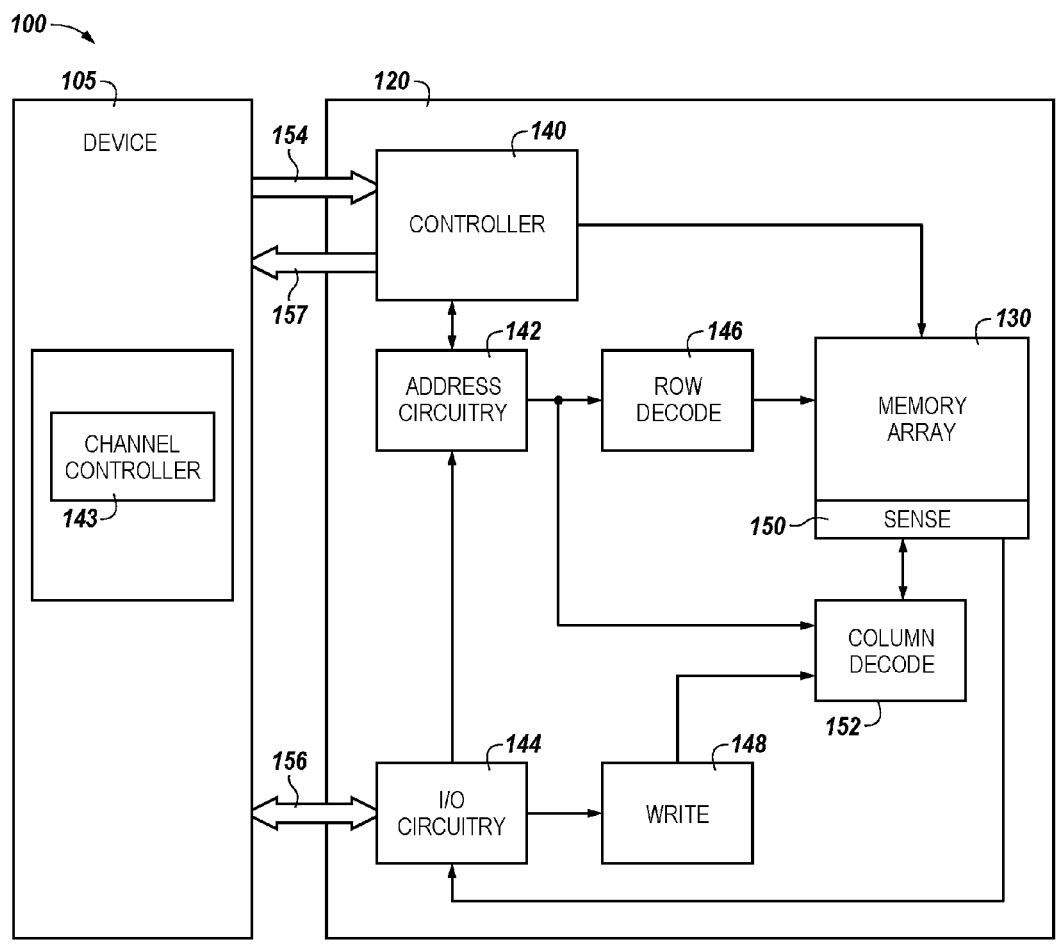
FIG. 1 is a block diagram of an apparatus in the form of a computing system including a memory device in accordance with a number of embodiments of the present disclosure.

The present disclosure includes apparatuses and methods related to shifting data. A number of embodiments of the present disclosure include an apparatus comprising a shift register comprising an initial stage and a final stage. The shift register may be configured such that a clock signal may be initiated at the final stage of the shift register.

A number of embodiments of the present disclosure can facilitate shifting data in a more efficient manner as compared to previous approaches. For example, embodiments include limiting clock delay (e.g., a time for a clock to propagate from one stage of a shift register to the next) and/or data delay (e.g., a time for data to propagate from one stage to the next) such that a time associated with clock delay and a time associated with data delay are similar (e.g., matched). In a number of embodiments, a clock signal applied to a shift register can be initiated at (e.g., applied first to) the output stage of a shift register as opposed to being initiated at the input stage of the shift register such that the clock signal propagates in a direction opposite to the direction of data shift. Propagating a clock signal in a direction opposite to the direction of data shift can provide a number of benefits. For instance, as described further below, initiating a clock signal at a final output stage (e.g., an end stage of the shift register configured to shift data in a direction from an initial stage toward the end stage) of a shift register can reduce the delay (e.g., parasitic delay) associated with performing a rotation. As used herein, a rotation refers to shifting data from a final output stage (e.g., a serial output stage) located at one end of a shift register to an initial stage (e.g., a serial input stage) located at the opposite end of the shift register. For instance, for a shift register configured to shift data rightward, a rotate right operation can include shifting a data value from a rightmost stage of the shift register directly to the leftmost stage of the shift register. Similarly, for a shift register configured to shift data leftward, a rotate left operation can include shifting a data value from a leftmost stage of the shift register directly to the rightmost stage of the shift register.

In a number of embodiments, a data path from the final output stage of a shift register to a first input stage of a shift register can be matched, or substantially matched, to the clock path. For example, the data path and the clock path for a shift register can include a same number of and/or size of gain devices, and/or can have the same wiring configuration, which can provide benefits such as providing a speed for shifting a data value from the end stage to the initial stage (e.g., in association with a rotation) to be similar to the speed at which a data value is shifted from one stage to a next (e.g., physically adjacent) stage.

In general, the speed of various shift registers is dependent on two components: clock generation (e.g., how fast the clock can sequence), and propagation delay. Propagation delay is generally comprised of two components as well. The first component of propagation delay is the time required for the clock to propagate from one stage to the next stage. The second component of propagation delay is the time required for data to shift from one stage to the next.

In some previous approaches, propagation delays from one shift register stage (e.g., storage location) to the next are on the order of 0.1 nanoseconds, while the clock generation time is on the order of 2.0 nanoseconds. These approximate times are valid for storage locations that are located physically close to one another, for example, storage locations that are physically separated by 25 microns or less. However, as the number of storage locations increases (e.g., when the number of cells becomes greater than 100) for a given shift register, the propagation delays for data to travel from a final output stage of the shift register back to the first input stage (e.g., in association with a rotation) can increase beyond the approximate values described above for a shift register with relatively close physical storage location spacing. For example, for a shift register containing around 16K stages, the propagation delay for data to travel from a final output stage of the shift register back to the first input stage can be on the order of 3 nanoseconds or greater. Combining this delay with the delay associated with propagating the clock from the initial input stage (e.g., the beginning of the shift register) to the final output stage (e.g., the end) of the shift register, which may be on the order of 3 nanoseconds, an overall minimum shift cycle time can be on the order of 6 nanoseconds.

Stated differently, previous approaches to shifting data, particularly to performing rotations, can suffer from shortcomings such as relatively long time delays in shifting data and increased power consumption, as compared to a number of embodiments described herein. Such shortcomings can become more pronounced as the size of shift registers (e.g., number of shift stages) increases.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, and sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Controller 140 (e.g., bank control logic and/or sequencer) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine (e.g., hardware and/or firmware in the form of an application specific integrated circuit (ASIC)), a sequencer, or some other type of controller. The controller 140 can control, for example, generation of clock signals and application of the clock signals to a shift register in association with shifting data in accordance with embodiments described herein.

As described further below, in a number of embodiments, the sensing circuitry 150 can comprise a number of sense amplifiers and a number of compute components, which may serve as, and be referred to herein as an accumulator, and can be used to perform logical operations (e.g., on data associated with complementary data lines). In a number of embodiments, storage locations (e.g., latches) corresponding to the compute components can serve as stages of a shift register. For example, clock signals can be applied to the compute components to shift data from one compute component to an adjacent compute component. As described further below, a rotation operation can be performed in association with operating the compute components as a shift register (e.g., by shifting a data value from a compute component at an end of the array directly to a compute component at an opposite end of the array). In a number of embodiments, a clock signal associated with shifting data via the number of compute components can be initiated at a final output stage and propagated in a direction opposite to the direction at which the data is shifted (e.g., the clock signal can be propagated leftward when the shift register is configured to shift data rightward and vice versa). For example, the shift register may be configured such that a clock signal is initiated at the final output stage of the shift register.

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store (e.g., cache and/or buffer) results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

Figure 2:
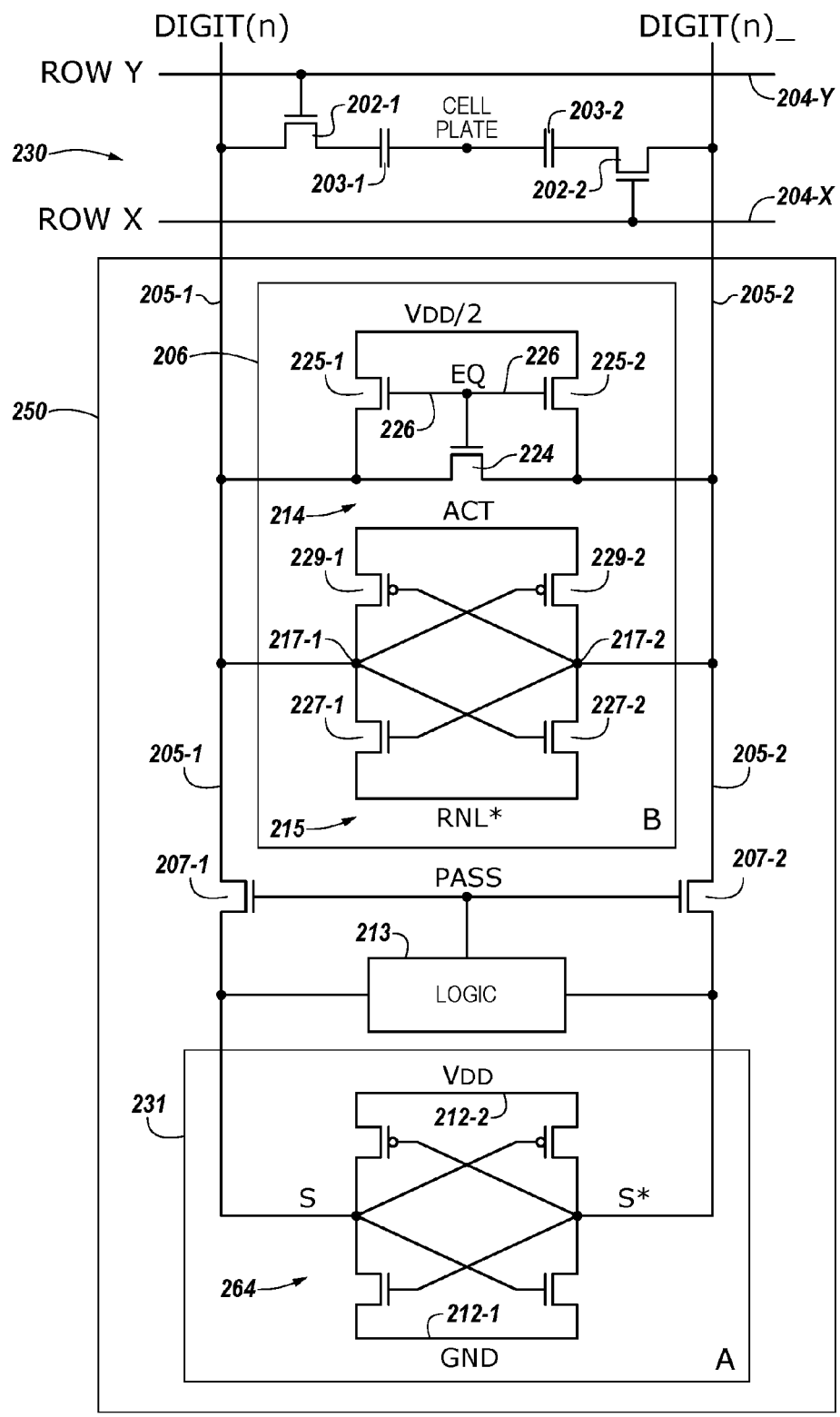
FIG. 2 is a schematic diagram of a portion of a memory array including sensing circuitry in accordance with a number of embodiments of the present disclosure.

FIG. 2 is a schematic diagram illustrating a portion of a memory array 230 including sensing circuitry in accordance with a number of embodiments of the present disclosure. The sensing component 250 represents one of a number of sensing components that can correspond to sensing circuitry 150 shown in FIG. 1.

In the example shown in FIG. 2, the memory array 230 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 202-1 and capacitor 203-1, and a second memory cell comprises transistor 202-2 and capacitor 203-2, etc.

The cells of the memory array 230 can be arranged in rows coupled by access lines 204-X (Row X), 204-Y (Row Y), etc., and columns coupled by pairs of complementary sense lines (e.g., digit lines 205-1 labelled DIGIT(n) and 205-2 labelled DIGIT(n)_ in FIG. 2). Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Memory cells can be coupled to different digit lines and word lines. For instance, in this example, a first source/drain region of transistor 202-1 is coupled to digit line 205-1, a second source/drain region of transistor 202-1 is coupled to capacitor 203-1, and a gate of transistor 202-1 is coupled to word line 204-Y. A first source/drain region of transistor 202-2 is coupled to digit line 205-2, a second source/drain region of transistor 202-2 is coupled to capacitor 203-2, and a gate of transistor 202-2 is coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The digit lines 205-1 and 205-2 of memory array 230 are coupled to sensing component 250 in accordance with a number of embodiments of the present disclosure. In this example, the sensing component 250 comprises a sense amplifier 206 and a compute component 231 corresponding to a respective column of memory cells (e.g., coupled to a respective pair of complementary digit lines). The sense amplifier 206 is coupled to the pair of complementary digit lines 205-1 and 205-2. The compute component 231 is coupled to the sense amplifier 206 via pass gates 207-1 and 207-2. The gates of the pass gates 207-1 and 207-2 can be coupled to selection logic 213.

Figure 3:
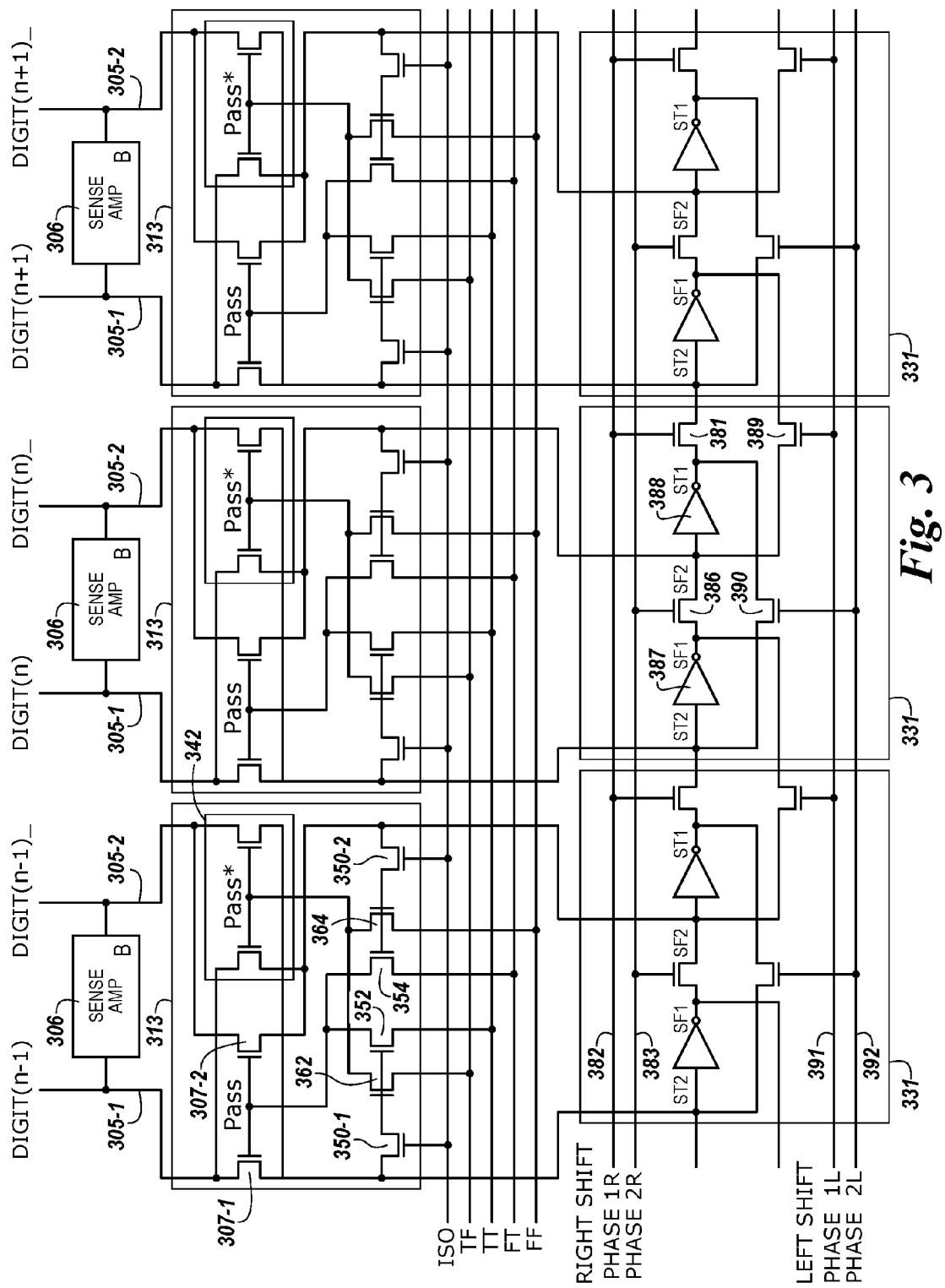
FIG. 3 is a schematic diagram illustrating sensing circuitry in accordance with a number of embodiments of the present disclosure.

The selection logic 213 can include pass gate logic (e.g., isolation transistors 350-1 and 350-2 coupled to an ISO signal, and logic selection transistors 362, 352, 354, and 364 coupled to respective logic selection control signals TF, TT, FT, and FF as shown in FIG. 3) for controlling pass gates that couple the pair of complementary digit lines un-transposed between the sense amplifier 206 and the compute component 231 and swap gate logic (e.g., 342 shown in FIG. 3) for controlling swap gates that couple the pair of complementary digit lines transposed between the sense amplifier 206 and the compute component 231. The selection logic 213 can be coupled to the pair of complementary digit lines 205-1 and 205-2 and configured to perform logical operations on data stored in array 230. For instance, the selection logic 213 can be configured to control the state of (e.g., turn on/turn off) pass gates 207-1 and 207-2 based on a selected logical operation that is being performed.

The sense amplifier 206 can be operated to determine a data value (e.g., logic state) stored in a selected memory cell. The sense amplifier 206 can comprise a cross coupled latch 215 (e.g., gates of a pair of transistors, such as n-channel transistors 227-1 and 227-2 are cross coupled with the gates of another pair of transistors, such as p-channel transistors 229-1 and 229-2), which can be referred to herein as a primary latch. However, embodiments are not limited to this example.

In operation, when a memory cell is being sensed (e.g., read), the voltage on one of the digit lines 205-1 or 205-2 will be slightly greater than the voltage on the other one of digit lines 205-1 or 205-2. An ACT signal and an RNL* signal can be driven low to enable (e.g., fire) the sense amplifier 206. The digit line 205-1 or 205-2 having the lower voltage will turn on one of the transistors 229-1 or 229-2 to a greater extent than the other of transistors 229-1 or 229-2, thereby driving high the digit line 205-1 or 205-2 having the higher voltage to a greater extent than the other digit line 205-1 or 205-2 is driven high.

Similarly, the digit line 205-1 or 205-2 having the higher voltage will turn on one of the transistors 227-1 or 227-2 to a greater extent than the other of the transistors 227-1 or 227-2, thereby driving low the digit line 205-1 or 205-2 having the lower voltage to a greater extent than the other digit line 205-1 or 205-2 is driven low. As a result, after a short delay, the digit line 205-1 or 205-2 having the slightly greater voltage is driven to the voltage of the supply voltage $V_{DD}$ through a source transistor, and the other digit line 205-1 or 205-2 is driven to the voltage of the reference voltage (e.g., ground) through a sink transistor. Therefore, the cross coupled transistors 227-1 and 227-2 and transistors 229-1 and 229-2 serve as a sense amplifier pair, which amplify the differential voltage on the digit lines 205-1 and 205-2 and operate to latch a data value sensed from the selected memory cell.

Embodiments are not limited to the sensing component configuration illustrated in FIG. 2. As an example, the sense amplifier 206 can be a current-mode sense amplifier and/or a single-ended sense amplifier (e.g., sense amplifier coupled to one digit line). Also, embodiments of the present disclosure are not limited to a folded digit line architecture such as that shown in FIG. 2.

In this example, the sense amplifier 206 includes equilibration circuitry 214, which can be configured to equilibrate the digit lines 205-1 and 205-2. The equilibration circuitry 214 comprises a transistor 224 coupled between digit lines 205-1 and 205-2. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 is coupled to digit line 205-1, and a second source/drain region of transistor 225-2 is coupled to digit line 205-2. Gates of transistors 224, 225-1, and 225-2 can be coupled together and to an equilibration (EQ) control signal line 226. As such, activating EQ enables the transistors 224, 225-1, and 225-2, which effectively shorts digit lines 205-1 and 205-2 together and to the equilibration voltage (e.g., $V_{DD}/2$). Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

In a number of embodiments, compute component 231 can comprise a number of transistors formed on pitch with the transistors of the sense amplifier 206 and/or the memory cells of the array 230, which may conform to a particular feature size (e.g., $4F^2$, $6F^2$, etc.). As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., a ground voltage GND), such that the secondary latch is continuously enabled. The configuration of the compute component 231 is not limited to that shown in FIG. 2, and various other embodiments are feasible. In a number of embodiments, the compute component 231 can serve as a stage of a shift register with the secondary latch storing a data value that can be shifted to a latch of another (e.g., adjacent) stage of the shift register.

FIG. 3 is a schematic diagram illustrating sensing circuitry in accordance with a number of embodiments of the present disclosure. FIG. 3 shows a number of sense amplifiers 306 coupled to respective pairs of complementary sense lines 305-1 and 305-2, and a corresponding number of compute components 331 coupled to the sense amplifiers 306 via pass gates 307-1 and 307-2. The sense amplifiers 306 and compute components 331 shown in FIG. 3 can correspond to sensing circuitry 150 shown in FIG. 1, for example. The sensing circuitry shown in FIG. 3 includes logical operation selection logic 313, which can be operated as described further below.

Although not shown, memory cells, such as those described in FIG. 2, are coupled to the pairs of complementary sense lines 305-1 and 305-2 The cells of the memory array can be arranged in rows coupled by word lines and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 305-1 (D) and 305-2 (D_) respectively. Although only three pairs of complementary data lines (e.g., three columns) are shown in FIG. 3, embodiments of the present disclosure are not so limited, and an array of memory cells can include additional columns of memory cells and/or data lines (e.g., 4,096, 8,192, 16,384, etc.).

As shown in FIG. 3, the sensing components can comprise a sense amplifier 306, a compute component 331, and logical operation selection logic 313 corresponding to respective columns of memory cells (e.g., coupled to respective pairs of complementary data lines). The sense amplifier 306 can comprise, for example, a cross coupled latch, which can be referred to herein as a primary latch. The sense amplifiers 306 can be configured, for example, as described with respect to FIG. 2.

In the example illustrated in FIG. 3, the circuitry corresponding to compute components 331 is configured as a loadable shift register. For instance, each compute component 331 comprises a latch, which may be referred to herein as a secondary latch, and an additional number of transistors operable to transfer (e.g., shift) data values right and/or left (e.g., to a latch of an adjacent compute component 331). As described further herein, in a number of embodiments, the latch of the compute component 331 can serve as an accumulator.

The gates of the pass gates 307-1 and 307-2 can be controlled by a logical operation selection logic signal, Pass. For example, an output of the logical operation selection logic 313 can be coupled to the gates of the pass gates 207-1 and 207-2, as shown in FIG. 2.

The sensing circuitry shown in FIG. 3 also shows logical operation selection logic 313 coupled to a number of logic selection control input control signals ISO, TF, TT, FT, and FF via respective logic selection control input lines. Selection of a logical operation from a plurality of logical operations is determined from the condition of logic selection control signals on the logic selection control input control lines, as well as the data values present on the pairs of complementary sense lines 305-1 and 305-2 when the isolation transistors (e.g., 350-1 and 350-2) are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

A data value present on the pair of complementary sense lines 305-1 and 305-2 can be loaded into the corresponding compute component 331 via the pass gates 307-1 and 307-2. Each compute component 331 can comprise a stage of a loadable shift register. When the pass gates 307-1 and 307-2 are conducting (e.g., turned on), the data value on the pair of complementary sense lines 305-1 and 305-2 is passed to the corresponding compute component 331 and thereby loaded into the loadable shift register. The data value on the pair of complementary sense lines 305-1 and 305-2 can be the data value stored in the sense amplifier 306 when the sense amplifier is enabled (e.g., fired). The logical operation selection logic signal, Pass, is activated to turn on the pass gates 307-1 and 307-2.

Additionally, FIG. 3 shows swap transistors 342 configured to swap the orientation of the pair of complementary sense lines 305-1 and 305-2 between the sense amplifier 306 and the compute component 331. For instance, when the swap transistors 342 are turned on, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register.

In at least one embodiment, the compute components 331 can serve as respective stages of a shift register capable of shifting data values (e.g., right and/or left) and performing rotation operations (e.g., rotate right and/or rotate left).

As an example, the logical operation selection logic signal Pass can be activated (e.g., high) to turn on the pass gates 307-1 and 307-2 when the ISO control signal is activated and either the TT control signal is activated (e.g., high) with the data values on the true sense line being "1" or the FT control signal is activated (e.g., high) with the data values on the complement sense line being "1."

The data values on the true sense line being a "1" turns on logic selection transistors 352 and 362. The data values on the complementary sense line being a "1" turns on logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be turned on by a particular logic selection transistor.

The logical operation selection logic signal Pass* can be activated (e.g., high) to turn on the swap transistors 342 when the ISO control signal is activated and either the TF control signal is activated (e.g., high) with data values on the true sense line being "1," or the FF control signal is activated (e.g., high) with the data values on the complement sense line being "1." If either the respective control signal or the data values on the corresponding sense line (e.g., sense line to which the gate of the particular logic selection transistor is coupled) is not high, then the swap transistors 342 will not be turned on by a particular logic selection transistor.

Although not shown in FIG. 3, each column of memory cells can be coupled to a column decode line that can be activated to transfer, via a local I/O line, data values from corresponding sense amplifiers 306 and/or compute components 331 to a control component external to the array such as an external processing resource (e.g., host processor and/or other functional unit circuitry). The column decode line can be coupled to a column decoder. However, as described herein, in a number of embodiments, data need not be transferred via such I/O lines to perform shift operations in accordance with embodiments of the present disclosure. In a number of embodiments, shift circuitry can be operated in conjunction with sense amplifiers 306 and compute components 331 to perform shift operations without transferring data to a control component external to the array, for instance. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 331 can comprise a loadable shift register. In this example, each compute component 331 is coupled to a corresponding pair of complementary data lines 305-1/305-2, with a node ST2 being coupled to the particular data line (e.g., DIGIT(n)) communicating a "true" data value and with node SF2 being coupled to the corresponding complementary data line (e.g., DIGIT(n)_) communicating the complementary data value (e.g., "false" data value).

In this example, the loadable shift register comprises a first right-shift transistor 381 of a particular compute component 331 having a gate coupled to a first right-shift control line 382 (e.g., PHASE 1R), and a second right-shift transistor 386 of the particular compute component 331 having a gate coupled to a second right-shift control line 383 (e.g., PHASE 2R). Node ST2 of the particular control component is coupled to an input of a first inverter 387, whose output (e.g., node SF1) is coupled to a first source/drain region of transistor 386. The second source/drain region of transistor 386 is coupled to the input (e.g., node SF2) of a second inverter 388. The output (e.g., node ST1) of inverter 388 is coupled to a first source/drain region of transistor 381, and a second source/drain region of transistor 381 the particular compute component 331 is coupled to an input (e.g., node ST2) of a first inverter 387 of an adjacent compute component 331. The loadable shift register shown in FIG. 3 includes a first left-shift transistor 389 coupled between node SF2 of a particular compute component and node SF1 of an adjacent compute component 331. The loadable shift register shown in FIG. 3 also includes a second left-shift transistor 390 of a particular compute component 331 having a first source/drain region coupled to node ST2 and a second source/drain region coupled to node ST1. The gate of the first left-shift transistor 389 is coupled to a first left-shift control line 391 (e.g., PHASE 1L), and the gate of the second left-shift transistor 390 is coupled to a second left-shift control line 392 (e.g., PHASE 2L).

In operation, data values on a pair of complementary data lines (e.g., 305-1/305-2) can be loaded into the latch of a corresponding compute component 331 (e.g., by operating logical operation selection logic as described above). As an example, data values can be loaded into a corresponding compute component 331 via overwriting of the data values currently stored in the corresponding compute component 331 with the data value stored in the corresponding sense amplifier 306. Alternatively, data values may be loaded into a corresponding compute component by deactivating the control lines 382, 383, 391, and 392.

Once data values are loaded into the corresponding compute components 331, the "true" data values are separated from the complement data values by the first inverter 387. Shifting data to the right (e.g., to an adjacent compute component 331) can include alternating operation of the first right-shift transistor 381 and the second right-shift transistor 386, for example, via the PHASE 1R and PHASE 2R control signals being periodic signals that go high out of phase from one another (e.g., non-overlapping alternating square waves 180 out of phase). The transistor 390 can be turned on to latch the shifted data values.

An example of shifting data left via the shift register shown in FIG. 3 can include operating control signals 391 and 392 to move data values one control component to the left through transistors 389 and 390. Data from node ST2 is inverted through inverter 387 to node SF1. Activation of control signal 391 causes the data from node SF1 to move left through transistor 389 to node SF2 of a left-adjacent compute component 331. Data from node SF2 is inverted through inverter 388 to node ST1. Subsequent activation of control signal 392 causes the data from node ST1 to move through transistor 390 left to node ST2, which completes a left shift by one compute component 331. Data can be "bubbled" to the left/right by repeating the left/right shift sequence multiple times. Data values can be latched (and prevented from being further shifted) by maintaining the control signals 392 and 393 activated and control signals 382 and 391 deactivated (e.g., such that feedback is enabled for the respective compute component latches and such that the respective latches are isolated from each other). In a number of embodiments, the control signals PHASE 1R, PHASE 2R, PHASE 1L, and/or PHASE 2L can be shift clock signals such as those described below. As an example, although signals PHASE 1R, PHASE 2R, PHASE 1L, and PHASE 2L are identified on the left side of FIG. 3, the signals can be initiated on either end of the shift register in accordance with a number of embodiments described herein. For example, in association with shifting data rightward via the shift register comprising compute components 331, clock signals associated with shifting the data can be initiated on the rightmost end of the shift register and can be propagated leftward. In a similar manner, in association with shifting data leftward via the shift register comprising compute components 331, clock signals associated with shifting the data can be initiated on the leftmost end of the shift register and can be propagated rightward. For example, the shift register, which includes compute components 331 can be configured such that clock signals associated with shifting the data can be initiated at the final stage of the shift register or at an initial stage of the shift register.

Embodiments of the present disclosure are not limited to the shifting capability described in association with the compute components 331. For example, a number of embodiments can include shift circuitry in addition to and/or instead of the shift circuitry described in association with a loadable shift register.

Figure 4:
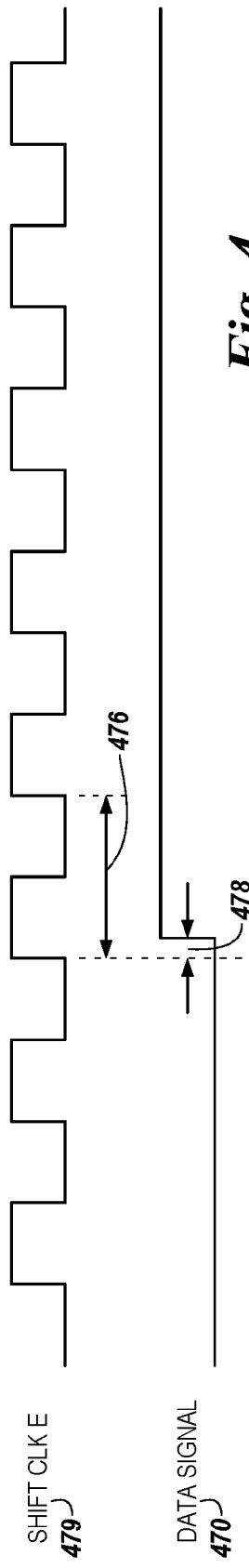
FIG. 4 is a timing diagram including a shift clock signal and a data signal associated with shifting data according to a previous approach.
Figure 5:
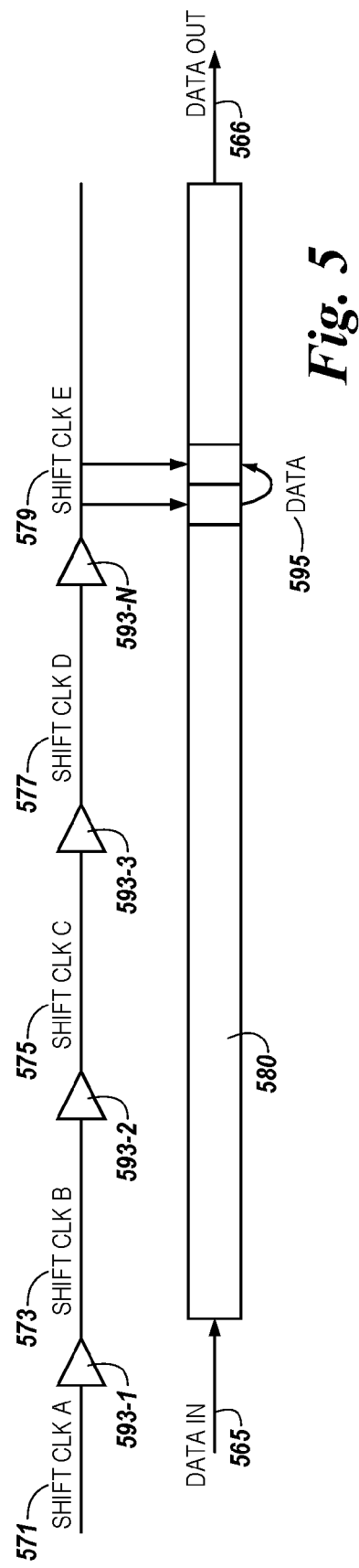
FIG. 5 illustrates a clock path and a data path associated with shifting data in a shift register according to a previous approach.

FIG. 4 is a timing diagram including a shift clock signal and a data signal associated with shifting data according to a previous approach. FIG. 5 illustrates a clock path and a data path associated with shifting data in a shift register according to a previous approach. As an example, the signals shown in FIG. 4 can be used in association with shifting data within shift register 580 illustrated in FIG. 5. For instance, clock signal 479 can correspond to clock signal 579, and data signal 470 can represent a data value 595 being shifted (e.g., from one stage to an adjacent stage) within shift register 595.

In the example described in FIGS. 4 and 5, data can be shifted on rising edges of shift clock signal 479, with time 478 representing a data delay associated with shifting a data value (e.g., 595) within the shift register 580 (e.g., from one stage to an adjacent stage), and with time 476 representing a time available for movement of the data value to a next stage (e.g., the time between consecutive rising edges of clock signal 479). As shown in FIGS. 4 and 5, when the data value 595 is shifted to an adjacent storage location, the data delay 478 is smaller than the available time 476 for data propagation to the next stage. Stated differently, when shifting a data value 595 to an adjacent storage location at a rising edge of shift clock signal 479, the amount of time available between consecutive rising clock edges (e.g., time 476) is greater than the data delay 478. As used herein, "data delay" is an inherent amount of time associated with completing a shift of a data value from one stage (e.g., storage location) to another (e.g., adjacent) stage.

Figure 7:
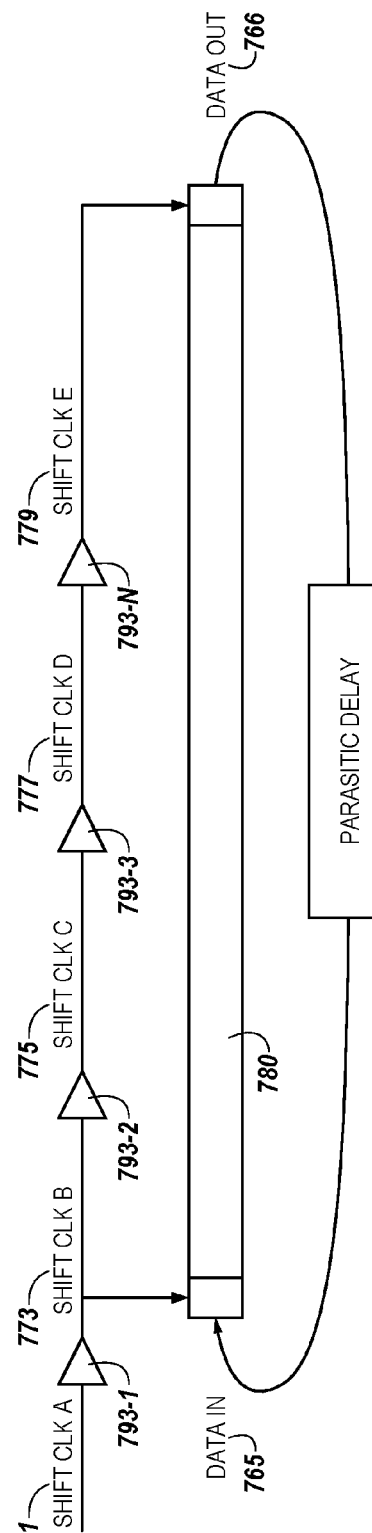
FIG. 7 illustrates a clock path and a data path associated with shifting data in a shift register according to a previous approach.

In order to propagate the clock signal across the shift register 580, a plurality of gain devices (e.g., repeaters) 593-1, 593-2, ..., 593-N can be provided to receive and retransmit the clock signal, as described in more detail in connection with FIGS. 7 and 9.

As shown in FIG. 5, a shift clock can be initiated at the output of each repeater among the plurality of repeaters 593-1, 593-2, ..., 593-N. For example, an initial shift clock signal 571 (shift clk A) can be propagated to a first repeater (e.g., repeater 593-1). The incoming shift clock signal 571 can be retransmitted from repeater 593-1 as resultant shift clock signal 573 (shift clk B). Similarly, shift clock signals 575 (shift clk C), 577 (shift clk D), and 579 (shift clk E) can be received and retransmitted by respective repeaters among the plurality of repeaters 593-1, 593-2, ..., 593-N. In FIG. 5, "data in" 565 corresponds to an end of shift register 580 that comprises an initial input stage, and "data out" 566 corresponds to an opposite end of the shift register that comprises a final output stage. As such, in this example, data is shifted rightward (e.g., from end 565 toward end 560), with the shift clock signal being initiated at the input end 565 and propagated in the same direction as the direction in which the data 595 is shifted (e.g., rightward).

Figure 6:
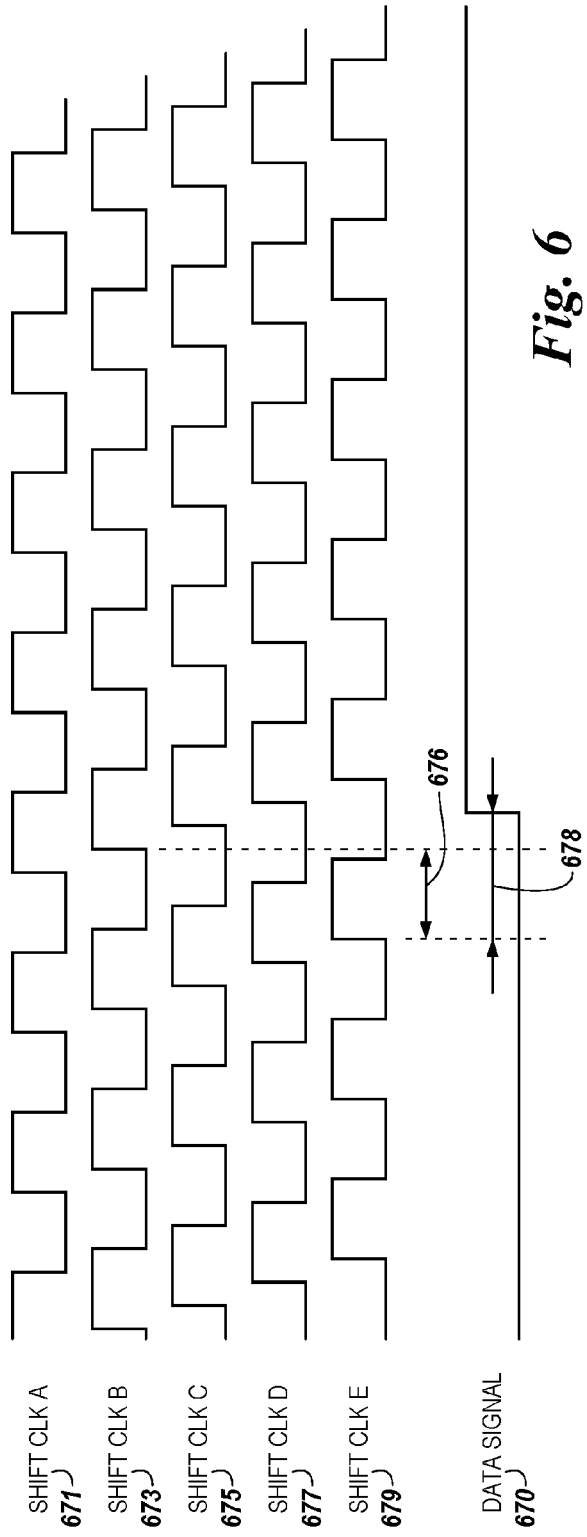
FIG. 6 illustrates a timing diagram including shift clock signals and a data signal associated with shifting data according to a previous approach.

FIG. 6 is a timing diagram including a number of shift clock signals and a data signal associated with shifting data according to a previous approach. FIG. 7 illustrates a clock path and a data path associated with shifting data in a shift register according to a previous approach. As an example, the signals shown in FIG. 6 can be used in association with shifting data within shift register 780 illustrated in FIG. 7.

The example of FIG. 6 includes a plurality of shift clock signals 671 (shift clk A), 673 (shift clk B), 675 (shift clk C), 677 (shift clk D), and 679 (shift clk E) that are out of phase with each other, for example, such that the rising edges of the respective shift clocks 671, 673, 675, 677, 679 occur at a different point in time. As an example, data signal 670 can represent a data value being shifted from a final output stage 766 of the shift register 780 (e.g., on a rising edge of clock signal 679) to an initial input stage 765 of the shift register 780 (e.g., on a rising edge of clock signal 673) in association with a rotate right operation.

As illustrated in FIG. 6, the data delay 678 (e.g., the time for the data value shift from stage 766 to stage 765 to complete) is greater than an amount of time 676 available for data shifting (e.g., the time between the rising edge of clock signal 679 and the rising edge of clock signal 673). Accordingly, one or more of the clock signals 671, 673, 675, 677, 679 may need to be delayed and/or have one or more of their frequencies altered to make up for the parasitic delay 767 associated with shifting data from a final output stage 766 of the shift register 780 to an input stage 765 of the shift register 780. A plurality of gain devices 793-1, 793-2, ..., 793-N are provided along the clock path.

FIG. 8 illustrates a timing diagram including a data signal and a plurality of shift clock signals associated with shifting data in accordance with a number of embodiments of the present disclosure. FIG. 9 illustrates a clock path and a data path associated with shifting data in a shift register in accordance with a number of embodiments of the present disclosure. In at least one embodiment, the signals shown in FIG. 8 can be used in association with shifting data within shift register 980 illustrated in FIG. 9. In a number of embodiments, the shift register 980 can be a shift register such as the shift register described above in association with FIG. 3.

The example of FIG. 8 includes a plurality of shift clock signals 871 (shift clk A), 873 (shift clk B), 875 (shift clk C), 877 (shift clk D), and 879 (shift clk E) that are out of phase with each other, for example, such that the rising edges of the respective shift clock signals 871, 873, 875, 877, 879 occur at a different point in time. In some embodiments, one or more of the respective shift clocks 871, 873, 875, 877, 879 are provided by a clock driver (not shown). For example, a clock driver can be coupled to the shift register 980 and/or the PHASE 1R and PHASE 2R control signals illustrated in FIG. 3. In a number of embodiments, a controller such as controller 140 shown in FIG. 1 can serve as a clock driver; however, embodiments are not so limited. As an example, data signal 870 can represent a data value being shifted from a final output stage 966 of the shift register 980 (e.g., on a rising edge of clock signal 873) to an initial input stage 965 of the shift register 980 (e.g., on a rising edge of clock signal 879) in association with a rotate right operation. As illustrated in FIG. 8, the data delay 878 (e.g., the time for the data value shift from stage 966 to stage 965 to complete) is less than an amount of time 876 available for data shifting (e.g., the time between consecutive rising edges of clock signal 879). Accordingly, the example illustrated in FIGS. 8 and 9 can have reduced and/or eliminated parasitic delay associated with performing a rotation operation as compared to the previous approach described in FIGS. 6 and 7.

In this example, the data path (e.g., path of data signal 870) and clock path (e.g., path of shift clock signals 873, 875, 877, and 879) include a matched portion 874, in which the clock path and data path have a same number and/or size of gain devices. For instance, as shown in FIG. 9, data path 995 includes three gain devices 994-1, 994-2, and 994-N and clock path associated with performing a right rotation also includes three gain devices 993-2, 993-3, and 993-N. Providing a matched portion can provide benefits such as reducing the delay associated with performing rotations, among other benefits. Embodiments are not limited to propagating data 870 at a rising clock edge of one or more of the shift clocks 871, 873, 875, 877, 879. For example, data 870 may be propagated at a falling clock edge or at both a rising and falling clock edge (e.g., a double data rate transfer).

The plurality of shift clock signals 971 (shift clk A), 973 (shift clk B), 975 (shift clk C), 977 (shift clk D), and 979

(shift clk E) can be respective shift clock signals 871, 873, 875, 877, and 879 shown in FIG. 8. In contrast to the example in FIG. 7, in which the shift clock signals are propagated in a same direction as a direction in which the data is shifted, in FIG. 9, the shift clock signals 971, 973, 975, 977, and 979 are propagated in an opposite (e.g., contrariwise) direction as the direction in which data is shifted. For instance, in the example shown in FIG. 9, data is shifted rightward (e.g., from an initial input stage 965 toward the final output stage 966), and the shift clock signals are propagated leftward. As shown in FIG. 9, the shift clock (e.g., 971) is initiated at the final output stage 966 of the shift register 980, as compared to the previous approach shown in FIG. 7, in which the shift clock 771 is initiated at the initial input stage of the shift register 780.

The present disclosure includes apparatuses and methods related to shifting data. A number of embodiments of the present disclosure include an apparatus comprising a shift register and a clock signal that is initiated at a final output stage of the shift register.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
  a shift register comprising:
    an initial stage corresponding to a first storage location of the shift register and located at a first end of the shift register; and
    a final stage corresponding to a final storage location of the shift register and located at a second end of the shift register,
  wherein:
    the initial stage of the shift register and the final stage of the shift register are disposed at opposite ends of the shift register;
    the shift register is configured such that a clock signal is initiated at the final stage of the shift register; and
    the shift register is configured to send a data value stored in the final stage directly to the initial stage.

2. The apparatus of claim 1, further comprising a clock driver to generate the clock signal, wherein the clock driver is disposed at an end of the shift register opposite an end of the shift register at which a first storage location associated with the shift register is disposed.

3. The apparatus of claim 1, comprising
  an array of memory cells coupled to sensing circuitry including the shift register; and
  a clock driver coupled to the array, the clock driver to:
    generate the clock signal; and
    control timing of shifting data stored in the sensing circuitry.

4. The apparatus of claim 3, comprising second sensing circuitry coupled to the sensing circuitry, the second sensing circuitry configured to receive data from an output of the sensing circuitry.

5. The apparatus of claim 1, wherein a direction of propagation of the clock signal is different than a direction of data propagation from an initial stage of the shift register to the final stage of the shift register.

6. The apparatus of claim 1, wherein the clock signal is initiated on an end of the shift register opposite to an end of the shift register at which the first storage location is disposed.

7. The apparatus of claim 1, comprising:
  a number of repeater devices disposed along a data path; and
  a number of repeater devices disposed along a clock signal path.

8. The apparatus of claim 7, wherein the number of repeater devices disposed along the data path is the same as the number of repeater devices disposed along the clock signal path.

9. The apparatus of claim 7, wherein a wiring configuration associated with the number of repeater devices disposed along the data path is the same as a wiring configuration associated with the number of repeater devices disposed along the clock signal path.

10. The apparatus of claim 1, wherein the shift register is configured to send a data value stored in the final stage to the initial stage without altering a frequency of the clock signal.

11. The apparatus of claim 1, further comprising a plurality of storage locations located between the first storage location and the final storage location of the shift register.

12. An apparatus, comprising:
  a master inverter associated with a first clock phase and coupled to a shift register; and
  a slave inverter associated with a second clock phase and coupled to the shift register,
  wherein:
    asserting the master inverter causes a data value to shift from a first stage to a second stage, the first stage corresponding to a first storage location of the shift register located at a first end of the shift register; and
    asserting the slave inverter causes the data value to move from the second stage to a third stage, the third stage corresponding to a final storage location of the shift register and located at a second end of the shift register,
    wherein the first stage and the third stage are located at opposite ends of the shift register, and wherein the shift register is configured to cause the data value to move from the third stage directly to the first stage.

13. The apparatus of claim 12, comprising a clock driver coupled to the master inverter and the slave inverter, wherein the clock driver is configured to cause the first clock phase and the second clock phase to propagate in a different direction than a direction that the data value shifts.

14. The apparatus of claim 12, comprising a clock driver coupled to the master inverter and slave inverter, the clock driver to provide the first clock phase and the second clock phase.

15. The apparatus of claim 12, wherein the clock driver is disposed at an end of the apparatus different than an end of the apparatus where the master inverter is located.

16. An apparatus, comprising:
an array of memory cells;
sensing circuitry coupled to the array and comprising a shift register configured to:
receive a clock signal propagated in a first direction;
shift data stored in a second direction, from an initial stage corresponding to a first storage location of the shift register to a second stage;
shift data stored in the second stage to a final stage corresponding to a final storage location of the shift register, wherein the initial stage and the final stage are located at opposite ends of the shift register; and
shift data stored in the final stage directly to the initial stage, wherein the initial stage is at a first end of the shift register and the final stage is at a second end of the shift register.

17. The apparatus of claim 16, wherein the first direction and the second direction are different.

18. The apparatus of claim 16, wherein the first direction and the second direction are opposite.

19. The apparatus of claim 16, wherein the shift register includes greater than 100 stages.

20. The apparatus of claim 16, wherein the shift register is further configured to receive the clock signal at a stage of the shift register different from an initial stage of the shift register.

21. The apparatus of claim 16, wherein the shift register comprises a final output stage configured to receive the clock signal.

22. The apparatus of claim 16, wherein the shift register comprises a compute component that comprises transistors formed on pitch with memory cells of the array.

23. A method, comprising:
shifting data stored in sensing circuitry according to a clock signal,
wherein a direction that the data is shifted is different than a direction of propagation of the clock signal, and
wherein shifting the data includes performing a rotate operation to shift the data directly from an initial stage corresponding to a first storage location of the shift register and located at a first end of the shift register to a final stage corresponding to a final storage location of the shift register and located at a second end of the shift register, and wherein the first end of the shift register and the second end of the shift register are at opposite ends of the shift register.

24. The method of claim 23, wherein the sensing circuitry comprises a shift register, and wherein shifting data comprises shifting data stored in a first stage to a second stage during a clock cycle associated with the clock signal.

25. The method of claim 23, wherein the sensing circuitry comprises a shift register, and wherein the method includes generating the clock signal at a stage of the shift register different than an input stage of the shift register.

26. The method of claim 23, wherein the sensing circuitry comprises a shift register, and wherein the method includes generating the clock signal at a final output stage of the shift register.

27. The method of claim 23, wherein shifting the data includes shifting the data contrariwise to a direction of propagation of the clock signal in response to assertion of a phase of the clock signal.

28. The method of claim 23, wherein the sensing circuitry comprises a shift register, and wherein the method includes shifting data associated with the shift register from a final output stage of the shift register to an initial input stage of the shift register without altering a frequency associated with the clock signal.

* * * * *